(12) United States Patent
Park et al.

(10) Patent No.: US 12,217,802 B2
(45) Date of Patent: Feb. 4, 2025

(54) NON-VOLATILE MEMORY DEVICE, STORAGE DEVICE INCLUDING THE SAME, AND OPERATING METHOD THEREOF

(71) Applicant: SAMSUNG ELECTRONICS CO., LTD., Suwon-si (KR)

(72) Inventors: Jooyong Park, Bucheon-si (KR); Sangwon Park, Seoul (KR); Dongjin Shin, Hwaseong-si (KR); Suchang Jeon, Seoul (KR); Seungyong Choi, Daegu (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 234 days.

(21) Appl. No.: 17/648,311

(22) Filed: Jan. 19, 2022

(65) Prior Publication Data

US 2022/0415408 A1    Dec. 29, 2022

(30) Foreign Application Priority Data

Jun. 28, 2021    (KR) .......................... 10-2021-0083802

(51) Int. Cl.

| | |
|---|---|
| *G11C 16/26* | (2006.01) |
| *G11C 16/04* | (2006.01) |
| *G11C 16/08* | (2006.01) |
| *G11C 16/14* | (2006.01) |
| *G11C 16/20* | (2006.01) |

(52) U.S. Cl.
CPC .......... *G11C 16/26* (2013.01); *G11C 16/0483* (2013.01); *G11C 16/08* (2013.01); *G11C 16/14* (2013.01); *G11C 16/20* (2013.01)

(58) Field of Classification Search
CPC ..... G11C 16/26; G11C 16/0483; G11C 16/08; G11C 16/14; G11C 16/20; G06F 12/0246; G06F 3/0659
See application file for complete search history.

(56) References Cited

U.S. PATENT DOCUMENTS

| | | | |
|---|---|---|---|
| 7,251,190 B2 | 7/2007 | Imamiya et al. | |
| 7,486,559 B2 | 2/2009 | Morooka et al. | |
| 7,619,921 B2 | 11/2009 | Hosono et al. | |
| 7,660,155 B2 | 2/2010 | Byeon | |
| 7,679,133 B2 | 3/2010 | Son et al. | |
| 7,826,269 B2 | 11/2010 | Kang | |
| 8,352,780 B2 | 1/2013 | Brune et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |

(Continued)

FOREIGN PATENT DOCUMENTS

| | | |
|---|---|---|
| JP | 2006-004478 | 1/2006 |
| KR | 10-1416685 | 7/2014 |

*Primary Examiner* — Uyen Smet
(74) *Attorney, Agent, or Firm* — F. Chau & Associates, LLC

(57) ABSTRACT

A non-volatile memory device includes a meta area having a first region storing first initial data, and second regions storing second initial data, different from each other; a user area configured to store user data; an initialization register configured to store the first initial data or update the second initial data in whole or in part; and control logic configured to perform a read operation, a program operation, or an erase operation using the initial data stored in the initialization register.

20 Claims, 10 Drawing Sheets

(56) References Cited

U.S. PATENT DOCUMENTS

| | | | |
|---|---|---|---|
| 9,536,970 B2 | 1/2017 | Seol et al. | |
| 9,558,110 B2 | 1/2017 | Boursier et al. | |
| 11,037,635 B1* | 6/2021 | Lien | G11C 11/5628 |
| 2007/0016738 A1* | 1/2007 | Hosono | G11C 29/789 |
| | | | 711/170 |
| 2007/0253254 A1* | 11/2007 | Morooka | G11C 16/20 |
| | | | 365/185.18 |
| 2008/0209150 A1 | 8/2008 | Byeon | |
| 2013/0250677 A1* | 9/2013 | Nam | G11C 16/10 |
| | | | 365/185.03 |
| 2013/0258776 A1 | 10/2013 | Nagadomi | |
| 2015/0324613 A1 | 11/2015 | Park et al. | |
| 2019/0130135 A1* | 5/2019 | Park | G06F 3/0604 |
| 2020/0211653 A1* | 7/2020 | Chen | G06F 11/1048 |
| 2021/0048960 A1* | 2/2021 | Son | G11C 5/025 |

* cited by examiner

NON-VOLATILE MEMORY DEVICE, STORAGE DEVICE INCLUDING THE SAME, AND OPERATING METHOD THEREOF

CROSS-REFERENCE TO RELATED APPLICATION(S)

This application claims priority under 35 U.S.C. § 119 to Korean Patent Application No. 10-2021-0083802 filed on Jun. 28, 2021 in the Korean Intellectual Property Office, the disclosure of which is herein incorporated by reference in its entirety.

FIELD

The present disclosure relates to a non-volatile memory device, a storage device including the same, and an operating method thereof.

DISCUSSION OF RELATED ART

In general, a non-volatile memory device may store initialization information including product specifications, and may read the initialization information during booting in which power is applied. The non-volatile memory device may change a setting condition in order to match operation and reliability characteristics according to a request of a client. In general, such a setting condition may be changed by setting additional conditions, after information data read (IDR) is performed on a SET level. However, the additional setting may require additional time. In addition, when the non-volatile memory device is provided to the user as a single device, new information data should be written from a wafer level. In this case, quantity management thereof may be complicated.

SUMMARY

An embodiment of the present disclosure provides a non-volatile memory device in which an application usage may be readily selected by a user, a storage device including the same, and an operating method thereof.

According to an embodiment of the present disclosure, a non-volatile memory device includes a meta area having a first region storing first initial data, and second regions storing second initial data, different from each other; a user area configured to store user data; an initialization register configured to store the first initial data or update the second initial data in whole or in part; and control logic configured to receive a command latch enable (CLE) signal, an address latch enable (ALE) signal, a chip enable (CE) signal, a write enable (WE) signal, a read enable (RE) signal, and a data strobe (DQS) signal through control pins and latch a command or an address at an edge of the WE signal according to the CLE signal and the ALE signal, to perform a read operation, a program operation, or an erase operation using the initial data stored in the initialization register.

According to an embodiment of the present disclosure, a method of operating a storage device having a non-volatile memory device and a controller controlling the non-volatile memory device includes performing a power-up operation by supplying power; selecting an application usage according to the power-up operation; reading initial data according to the application usage; and setting a register of the non-volatile memory device with the read initial data, wherein the reading initial data according to the application usage includes reading first initial data related to a core operation from the non-volatile memory device; and reading second initial data, corresponding to the core operation, according to the application usage from the non-volatile memory device.

According to an embodiment of the present disclosure, a non-volatile memory device includes a memory cell array having a plurality of meta blocks having a plurality of memory cells connected to a plurality of word-lines and a plurality of bit-lines; a row decoder selecting a memory block, among the plurality of memory blocks, in response to an address; a voltage generator providing word-line voltages corresponding to a selected word-line and unselected word-lines, among the plurality of word-lines; page buffers connected to the plurality of bit-lines and reading data from memory cells connected to a selected word-line of the selected memory block among the plurality of memory blocks; and control logic controlling the row decoder, the voltage generator, and the page buffers, wherein at least one memory block, among the plurality of memory blocks, comprises a first region storing first initial data, and second regions storing second initial data, different from each other, and wherein the control logic is configured to read the first initial data stored in the first region and the second initial data stored in a second region, among the second regions, according to an initialization operation request, store the first initial data in an initialization register, and store the second initial data in all or a portion of the initialization register.

According to an embodiment of the present disclosure, a method of operating a non-volatile memory device includes receiving an initialization request; performing an initial read operation according to the initialization request; storing first and second initial data according to the initial read operation in registers; receiving a read command, a program command, or an erase command; and performing an operation according to the received command using the first and second initial data stored in the registers, wherein the initial read operation comprises a first read operation of reading the first initial data and a second read operation of reading the second initial data.

BRIEF DESCRIPTION OF THE DRAWINGS

The above and other embodiments of the present disclosure will be more clearly understood from the following detailed description, taken in conjunction with the accompanying drawings, in which.

DETAILED DESCRIPTION

In the following, the contents of the present disclosure will be described in detail with reference to the drawings to the extent that those of ordinary skill in the pertinent technical field may readily implement the teachings described herein.

A non-volatile memory device, a storage device including the same, and an operating method thereof, according to an embodiment of the present disclosure, may selectively use information data according to a user's intended purpose of use, such as to optimize performance or to optimize reliability.

Figure 1:
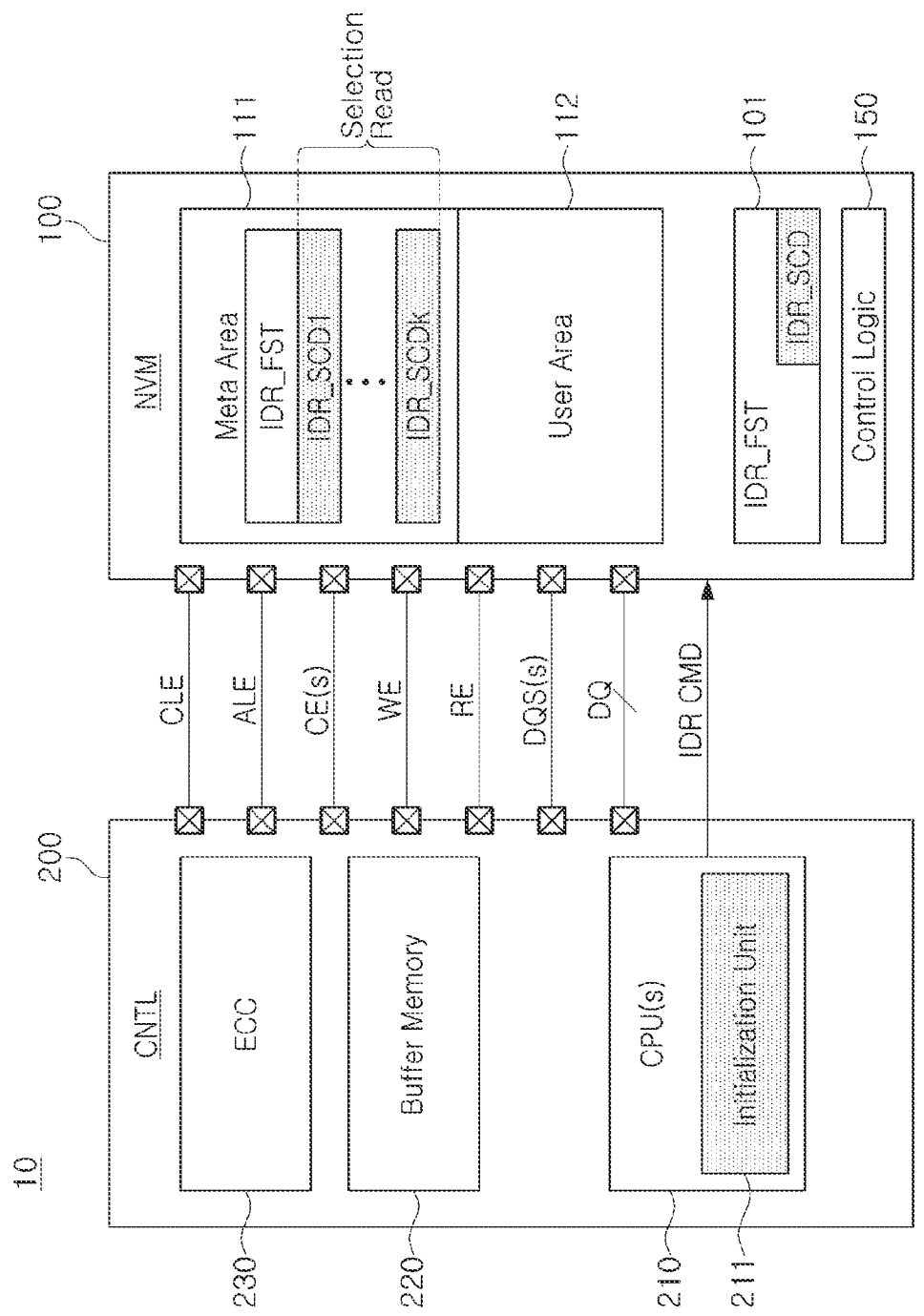
FIG. 1 is a block diagram illustrating a storage device 10 according to an embodiment of the present disclosure.

FIG. 1 illustrates a storage device 10 according to an embodiment of the present disclosure. Referring to FIG. 1, a storage device 10 may include at least one non-volatile memory device NVM(s) 100 and a controller CNTL 200.

The at least one non-volatile memory device 100 may be implemented to store data. The non-volatile memory device 100 may be a NAND flash memory, a vertical NAND flash memory, a NOR flash memory, a resistive random access memory (RRAM), a phase-change memory (PRAM), a magnetoresistive random access memory (MRAM), a ferroelectric random access memory (FRAM), a spin transfer torque random access memory (STT-RAM), or the like. Also, the non-volatile memory device 100 may be implemented to have a three-dimensional array structure. The present disclosure may be applicable not only to a flash memory device in which a charge storage layer is formed of a conductive floating gate, but also to a charge trap flash (CTF) in which a charge storage layer is formed of an insulating film. Hereinafter, for convenience of description, the non-volatile memory device 100 may be referred to as a vertical NAND flash memory device (VNAND), without limitation thereto.

The non-volatile memory device 100 may include a meta area 111 storing meta data, and a user area 112 storing user data. Each of the meta area 111 and the user area 122 may be implemented to include a plurality of memory blocks. Each of the plurality of memory blocks may include a plurality of pages. Each of the plurality of pages may include a plurality of memory cells. Each of the plurality of memory cells may store at least one bit. In an embodiment, the memory cell of the meta area 111 may be implemented as a single level cell (SLC). In an embodiment, the memory cell of the user area 112 may be implemented as one of a multi-level cell (MLC), a triple level cell (TLC), a quad level cell (QLC), a penta-level cell (PLC), or a hexa-level cell (HLC). It should be understood that a memory cell of the present disclosure is not limited to SLC, MLC, TLC, QLC, PLC, and HLC.

The meta area 111 may store initial data. In this case, the initial data may include information indicating a product specification of the non-volatile memory device 100. For example, the initial data may include information related to operation options, functions, characteristics, and operating modes of the non-volatile memory device 100. In an embodiment, the initial data may be stored in a page, a memory block, or a mat (MAT).

The initial data may include first initial data IDR_FST and second initial data IDR_SCD (e.g., IDR_SCD1, . . . IDR_SCDk, where k is an integer of 2 or more).

The first initial data IDR_FST may include first initial data that may be provided in common, regardless of a user. The first initial data may include information indicating a performance-related parameter of an operation of the non-volatile memory device 100.

The second initial data (e.g., IDR_SCD1, . . . IDR_SCDk) may include second initial data selectable by a user. The second initial data may include information indicating reliability-related parameters of an operation of the non-volatile memory device 100.

An initialization register 101 may store the first initial data IDR_FST. All or part of the initialization register 101 may store the second initial data IDR_SCD. In this case, the second initial data IDR_SCD may be second initial data selected in an initialization operation.

A control logic 150 may receive a command and an address from the controller CNTL 200, and may be implemented to perform an operation (a program operation, a reading operation, an erase operation, or the like) corresponding to the received command in memory cells corresponding to the address. In this case, the operation may be performed with reference to data stored in the registers 101 and 102.

The controller CNTL 200 may be connected to the at least one non-volatile memory device 100 through a plurality of control pins transmitting control signals (e.g., a command latch enable (CLE) signal, an address latch enable (ALE) signal, a chip enable (CE) signal, a write enable (WE) signal, a read enable (RE) signal, and the like). Also, the controller CNTL 200 may be implemented to use the control signals (CLE, ALE, CE(s), WE, RE, or the like) to control the non-volatile memory device 100. For example, the non-volatile memory device 100 may latch a command (CMD) or an address (ADD) at an edge of the WE signal according to the CLE signal and the ALE signal, to perform program operation/read operation/erase operation. For example, during a read operation, the chip enable signal CE is activated, CLE is activated during a command transmission interval, ALE is activated during an address transmission interval, and RE indicates that data is transmitted through the data signal line DQ. It can be toggled in the transmission section. The data strobe signal DQS may be toggled with a frequency corresponding to the data input/output speed. The read data may be sequentially transmitted in synchronization with the data strobe signal DQS.

In addition, the controller 200 may include at least one processor (e.g., a central processing unit (CPU)) 210, a buffer memory 220, and an error correction circuit 230.

The processor 210 may be implemented to control an overall operation of the storage device 10. The processor 210 may perform various management operations such as a cache/buffer management, a firmware management, a garbage collection management, a wear leveling management, a data duplication removal management, a read refresh/reclaim management, a bad block management, a multi-stream management, managements of data of a host and mapping of a non-volatile memory, a quality of service (QoS) management, a system resource allocation management, a non-volatile memory queue management, a read level management, an erase/program management, a hot/cold data management, a power loss protection management, a dynamic thermal management, an initialization management, a redundant array of inexpensive disk (RAID) management, or the like.

In particular, the processor 210 may be implemented to drive an initialization unit 211. In an embodiment, the initialization unit 211 may be implemented in firmware/software.

The initialization unit 211 may control the initialization operation of the non-volatile memory device 100. In an embodiment, the initialization unit 211 may generate an initial data read command IDR CMD for the initialization operation, when power is turned on. Addresses indicating the first initial data IDR_FST and the second initial data IDR_SCD may be transmitted, together with the initial data read command IDR CMD. For example, a first address for reading the first initial data IDR_FST and a second address for reading the second initial data IDR_SCD may be transmitted.

The buffer memory 220 may be implemented as a volatile memory (e.g., a static random access memory (SRAM), a dynamic RAM (DRAM), a synchronous RAM (SDRAM), and the like) or a non-volatile memory (e.g., a flash memory, a phase-change RAM (PRAM), a magnetoresistive RAM (MRAM), a resistive RAM (ReRAM), a ferroelectric RAM (FRAM), and the like).

The ECC circuit 230 may be implemented to generate an error correction code during a program operation, and use the error correction code during a reading operation to recover data. For example, the ECC circuit 230 may generate an error correction code (ECC) for correcting a failure bit or an error bit of data received from the non-volatile memory device 100. The ECC circuit 230 may perform error correction encoding of data provided to the non-volatile memory device 100, to form data to which a parity bit is added. The parity bit may be stored in the non-volatile memory device 100.

In addition, the ECC circuit 230 may perform error correction decoding on the data output from the non-volatile memory device 100. The ECC circuit 230 may correct an error using the parity bit. The ECC circuit 230 may correct an error using a coded modulation such as a low density parity check (LDPC) code, a BCH code, a turbo code, a Reed-Solomon code, a convolution code, a recursive systematic code (RSC), a trellis-coded modulation (TCM), a block coded modulation (BCM), or the like. When error correction is impossible or impractical in the error correction circuit 230, a read retry operation may be performed.

In general, it is desirable to change a setting condition of a non-volatile memory device in order to match operation and reliability characteristics according to a request of a client. In a general storage device, after reading initial data, an initialization condition required for operation of a non-volatile memory device may be set by adding an e-fuse by a user, if desired. The additional setting method may require additional time for initial setting. In addition, since the additional setting may be performed on a wafer level, management of the non-volatile memory device may be complicated.

In a non-volatile memory device 100 according to an embodiment of the present disclosure, by selecting a second initial data IDR_SCD according to a user's purpose or an application usage in an initialization operation, additional time may not be required for additional setting, and the additional setting may be also made on a SET level.

A storage device 10 according to an embodiment of the present disclosure may provide a customized non-volatile memory device 100 by enabling a combination of initial data (e.g., IDR_FST and IDR_SCD) to be selected during an initialization operation.

Figure 2:
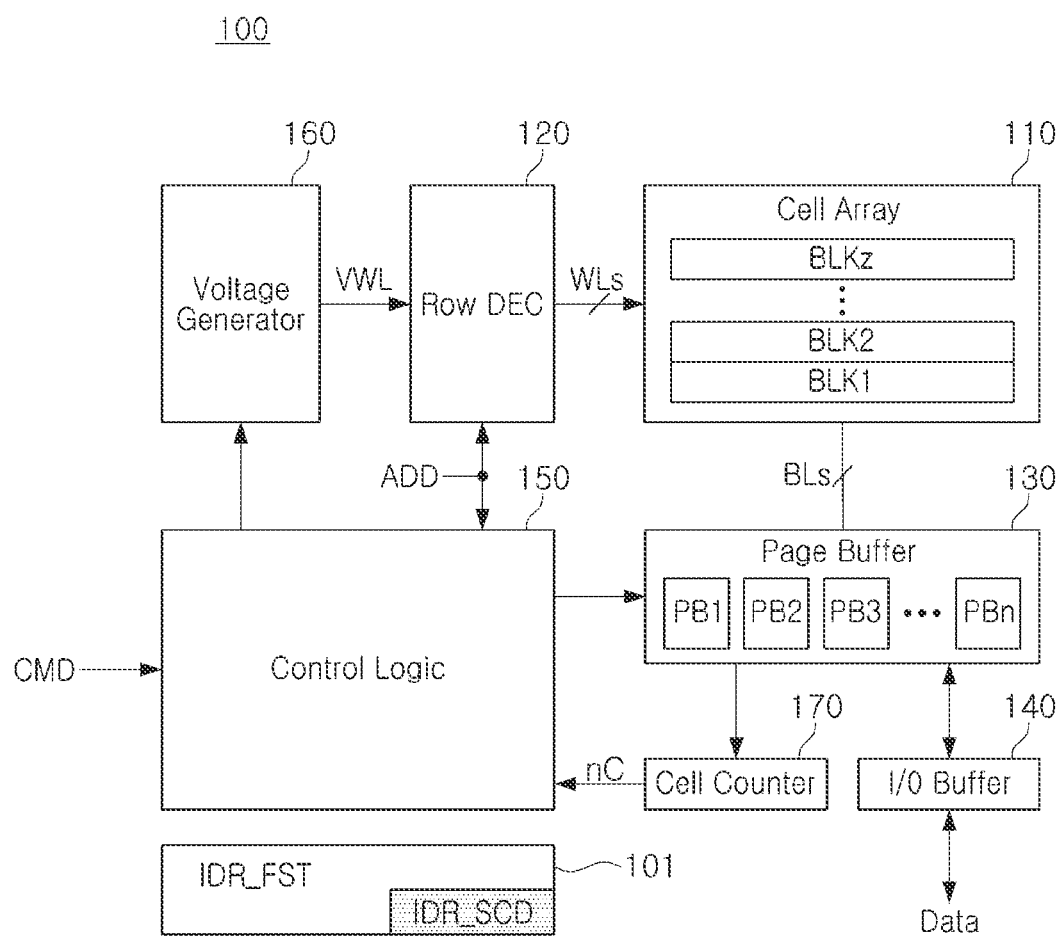
FIG. 2 is a block diagram illustrating the non-volatile memory device 100 illustrated in FIG. 1.

FIG. 2 illustrates the non-volatile memory device 100 illustrated in FIG. 1. Referring to FIG. 2, the non-volatile memory device 100 may include an initialization register 101, a memory cell array 110, a row decoder 120, a page buffer circuit 130, an input/output buffer circuit 140, control logic 150, a voltage generator 160, and a cell counter 170.

The initialization register 101 may store first initial data IDR_FST in an initialization operation. In addition, all or part of the initialization register 101 may store second initial data IDR_SCD in the initialization operation.

The memory cell array 110 may be connected to the row decoder 120 through word-lines WLs, or select lines SSL and GSL. The memory cell array 110 may be connected to the page buffer circuit 130 through bit-lines BLs. The memory cell array 110 may include a plurality of cell strings. Each channel of the cell strings may be formed in a vertical direction or a horizontal direction. Each of the cell strings may include a plurality of memory cells. In this case, the plurality of memory cells may be programmed, erased, or read by a voltage provided to the bit-lines BLs or the word-lines WLs. In general, a program operation may be performed on a page basis, and an erase operation may be performed on a block basis. Details of the memory cells will be described in U.S. Pat. Nos. 7,679,133, 8,553,466, 8,654,587, 8,559,235, and 9,536,970. In an embodiment, the memory cell array 110 may include a 2D memory cell array, and the 2D memory cell array may include a plurality of NAND strings arranged in row and column directions.

The row decoder 120 may be implemented to select any one of memory blocks BLK1 to BLKz (where, z is an integer equal to or greater than 2) of the memory cell array 110 in response to an address ADD. The row decoder 120 may select any one of word-lines of a selected memory block in response to the address ADD. The row decoder 120 may transfer a word-line voltage VWL corresponding to an operating mode to the word-lines of the selected memory block. During a program operation, the row decoder 120 may apply a program voltage and a verify voltage to a selected word-line, and may apply a pass voltage to an unselected word-line. During a reading operation, the row decoder 120 may apply a read voltage to a selected word-line, and may apply a read pass voltage to an unselected word-line.

The page buffer circuit 130 may be implemented to operate as a write driver or a sense amplifier according to an operating mode. For example, during a program operation, the page buffer circuit 130 may apply a bit-line voltage corresponding to data to be programmed to the selected bit-line. During a read operation or a verify read operation, the page buffer circuit 130 may sense data stored in a memory cell through the bit-line BL. A plurality of page buffers PB1 to PBn (where n is an integer equal to or greater than 2) included in the page buffer circuit 130 may be connected to at least one bit-line, respectively.

Each of the plurality of page buffers PB1 to PBn may be implemented to perform sensing and latching for an OVS sensing operation. For example, each of the plurality of page buffers PB1 to PBn may perform a plurality of sensing operations to identify any one state stored in the selected memory cells under control of the control logic 150. In addition, after each of the plurality of page buffers PB1 to PBn stores data sensed by the plurality of sensing operations, any one data may be selected under the control of the control logic 150. For example, each of the plurality of page buffers PB1 to PBn may perform the plurality of sensing operations to identify the any one state. In addition, each of the plurality of page buffers PB1 to PBn may select or output optimal data, among a plurality of pieces of data, sensed according to the control of the control logic 150.

The input/output buffer circuit 140 may provide, data externally provided, to the page buffer circuit 130. The input/output buffer circuit 140 may provide, a command CMD externally provided, to the control logic 150. The input/output buffer circuit 140 may provide, an address ADD externally provided, to the control logic 150 or the row decoder 120. In addition, the input/output buffer circuit 140 may externally output data sensed and latched by the page buffer circuit 130.

The control logic 150 may be implemented to control the row decoder 120 and the page buffer circuit 130 in response to a command CMD transmitted from an external source (e.g., the controller 200, see FIG. 1).

In addition, the control logic 150 may perform a first background operation 151 or a second background operation 152 according to control of a controller 200, and may be implemented to output health information according to the first background operation 151 and the second background operation 152 to the controller 200.

The voltage generator 160 may be implemented to generate various types of word-line voltages to be respectively applied to word-lines under control of the control logic 150 and a well voltage to be supplied to a bulk (e.g., well region) in which memory cells are formed. The word-line voltages respectively applied to the word-lines may include a program voltage, a pass voltage, a read voltage, read pass voltages, or the like.

The cell counter 170 may be implemented to count the number of memory cells corresponding to a specific threshold voltage range from data sensed by the page buffer circuit 130. For example, the cell counter 170 may process data respectively sensed in the plurality of page buffers PB1 to PBn, to count the number of memory cells having a threshold voltage in a specific threshold voltage range.

Figure 3:
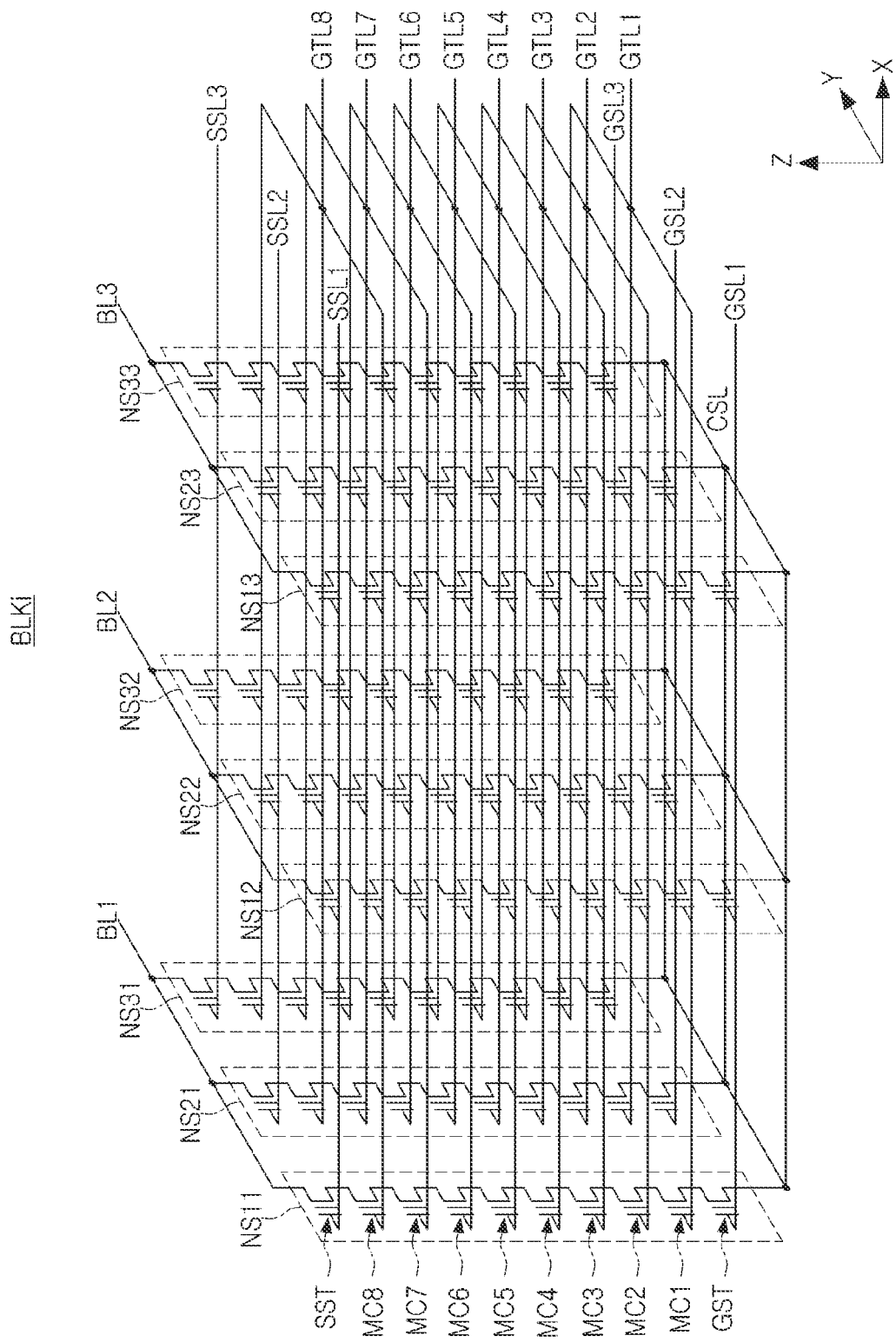
FIG. 3 is a circuit diagram illustrating a circuit diagram of a memory block according to an embodiment of the present disclosure.

FIG. 3 illustrates a circuit diagram of a memory block (BLKi, where i is an integer equal to or greater than 2) according to an embodiment of the present disclosure. A plurality of memory NAND strings included in the memory block BLKi may be formed in a direction, perpendicular to a substrate.

Referring to FIG. 3, the memory block BLKi may include a plurality of memory NAND strings NS11 to NS33 connected between bit-lines BL1, BL2, and BL3 and a common source line CSL. Each of the plurality of memory NAND strings NS11 to NS33 may include a string select transistor SST, a plurality of memory cells MC1, MC2, . . . , and MC8, and a ground select transistor GST. In FIG. 3, each of the plurality of memory NAND strings NS11 to NS33 is illustrated as including eight memory cells MC1, MC2, . . . , and MC8, but is not limited thereto.

The string select transistor SST may be connected to string select lines SSL1, SSL2, and SSL3 corresponding thereto. The plurality of memory cells MC1, MC2, . . . , and MC8 may be respectively connected to gate lines GTL1, GTL2, . . . , and GTL8 corresponding thereto. The gate lines GTL1, GTL2, . . . , and GTL8 may correspond to word-lines, and a portion of the gate lines GTL1, GTL2, . . . , and GTL8 may correspond to dummy word-lines. The ground select transistor GST may be connected to ground select lines GSL1, GSL2, and GSL3 corresponding thereto. The string select transistor SST may be connected to the bit-lines BL1, BL2, and BL3 corresponding thereto, and the ground select transistor GST may be connected to the common source line CSL.

Word-lines (e.g., WL1) having the same height may be connected in common, and the ground select lines GSL1, GSL2, and GSL3 and the string select lines SSL1, SSL2, and SSL3 may be separated from each other. FIG. 3 illustrates that the memory block BLKi is connected to eight gate lines GTL1, GTL2, . . . , and GTL8 and three bit-lines BL1, BL2, and BL3, but is not necessarily limited thereto.

Figure 4:
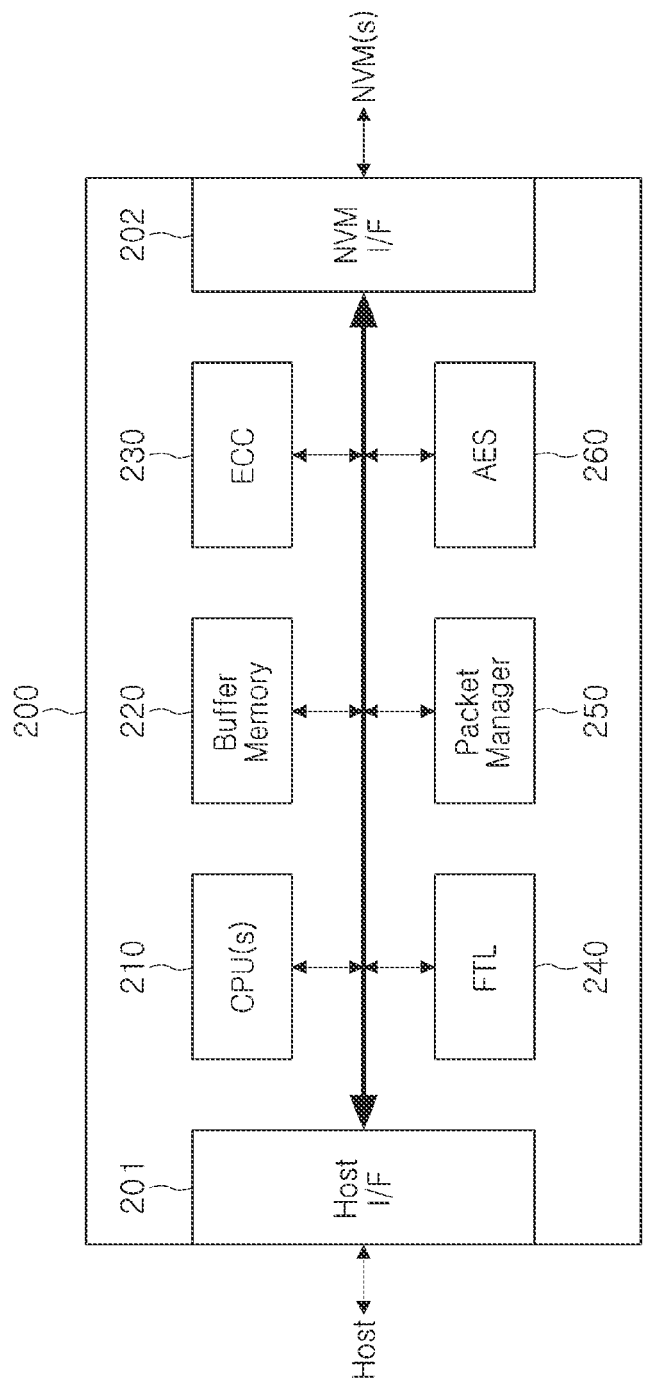
FIG. 4 is a block diagram illustrating a controller 200 according to an embodiment of the present disclosure.

FIG. 4 illustrates a controller 200 according to an embodiment of the present disclosure. Referring to FIG. 4, a controller 200 may include a host interface 201, a memory interface 202, at least one CPU 210, a buffer memory 220, an error correction circuit 230, a flash translation layer manager 240, a packet manager 250, and an encryption device 260.

The host interface 201 may be implemented to transmit and receive a packet to and from a host. A packet transmitted from the host to the host interface 201 may include a command or data to be written to a non-volatile memory 100. A packet transmitted from the host interface 201 to the host may include a response to a command or data read from the non-volatile memory 100. The memory interface 202 may transmit data to be written in the non-volatile memory 100 to the non-volatile memory 100 or receive data read from the non-volatile memory 100. This memory interface 202 may be implemented to comply with a standard protocol such as JDEC Toggle or ONFI.

The flash translation layer manager 240 may perform various functions such as address mapping, wear-leveling, and garbage collection. The address mapping operation may be an operation of converting a logical address, received from the host, into a physical address, used to actually store data in the non-volatile memory 100. The wear-leveling may be technology for using blocks in the non-volatile memory 100 uniformly to prevent excessive deterioration of a specific block therein, and may be implemented, for example, by a firmware technique balancing erase counts of physical blocks. The garbage collection may be technology for copying valid data of an existing block to a new block and then erasing the existing block, to secure capacity, usable in the non-volatile memory 100.

The packet manager 250 may generate a packet according to a protocol of an interface negotiated with the host, or may parse various pieces of information from a packet received from the host. Also, the buffer memory 220 may temporarily store data to be written in the non-volatile memory 100 or data read from the non-volatile memory 100. In an embodiment, the buffer memory 220 may be a component provided in the controller 200. In another embodiment, the buffer memory 220 may be disposed outside the controller 200.

The encryption device 260 may perform at least one of an encryption operation and a decryption operation on data input to a storage controller 210, using a symmetric-key algorithm. The encryption device 260 may perform encryption and decryption of data using an advanced encryption standard (AES) algorithm. The encryption device 260 may include an encryption module and a decryption module.

The first initial data IDR_FST may include a core condition for performing an operation of the non-volatile memory device 100, and the second initial data IDR_SCD may include an additional condition corresponding to the core condition.

Figure 5A:
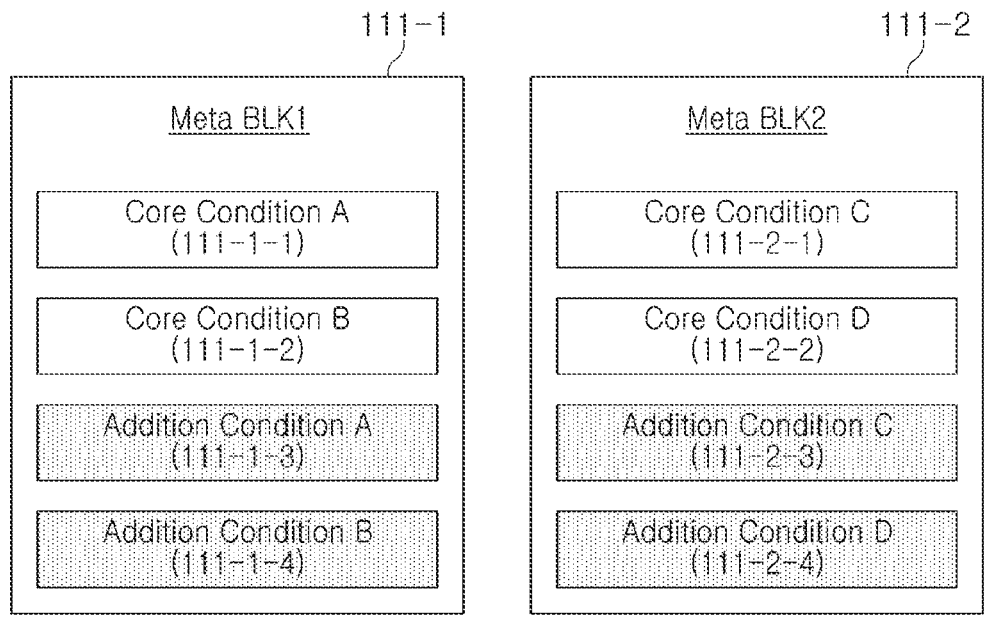
FIGS. 5A and 5B are block diagrams illustrating meta blocks storing initial data according to an embodiment of the present disclosure.
Figure 5B:
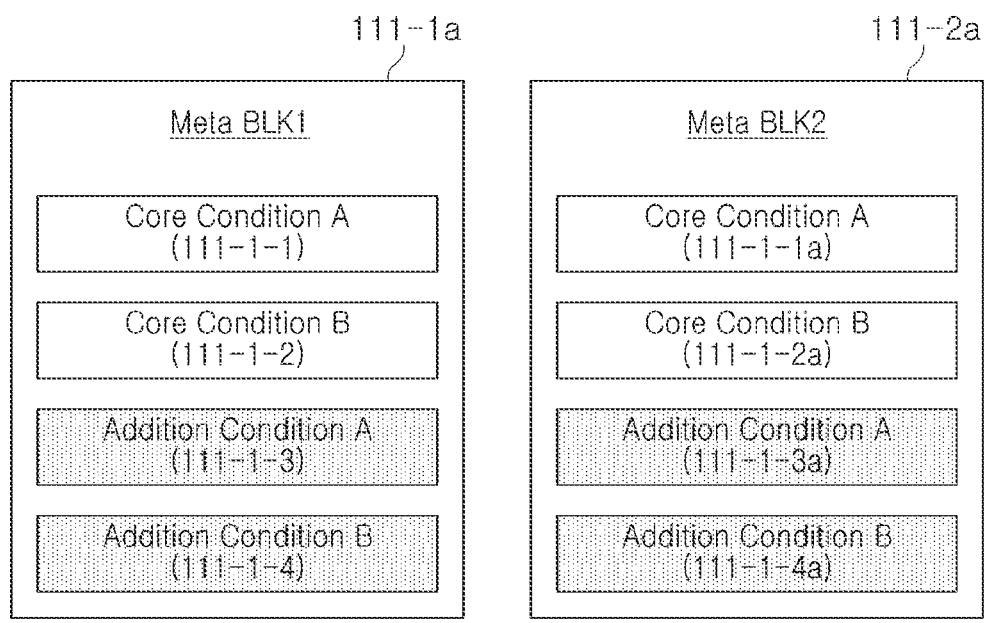

FIGS. 5A and 5B illustrate meta blocks storing initial data according to an embodiment of the present disclosure.

Referring to FIG. 5A, four operation sets A, B, C, and D are illustrated for a non-volatile memory device 100. First and second operation sets A and B may be stored in a first meta block 111-1, and third and fourth operation sets C and D may be stored in a second meta block 111-2. However, it should be understood that storage relation between an operation set and a meta block of the present disclosure is not limited thereto.

The first meta block 111-1 may include a page 111-1-1 storing a core condition of the first operation set A and a page 111-1-3 storing an additional condition of the first operation set A. In addition, the first meta block 111-1 may include a page 111-1-2 storing a core condition of the second operation set B and a page 111-1-4 storing an additional condition of the second operation set B.

The second meta block 111-2 may include a page 111-2-1 storing a core condition of the third operation set C and a page 111-2-3 storing an additional condition of the third operation set C. In addition, the second meta block 111-2 may include a page 111-2-2 storing a core condition of the fourth operation set D and a page 111-2-4 storing an additional condition of the fourth operation set D.

Referring to FIG. 5B, two operation sets A and B are illustrated for a non-volatile memory device 100. First and second operation sets A and B may be equally stored in meta blocks 111-1a and 111-2a. However, it should be understood that storage relation between an operation set and a meta block of the present disclosure is not limited thereto.

The first meta block 111-1a may include a page 111-1-1 storing a core condition of the first operation set A, a page 111-1-3 storing an additional condition of the first operation set A, a page 111-1-2 storing a core condition of the second operation set B and a page 111-1-4 storing an additional condition of the second operation set B.

The meta block 111-2a may include a page 111-1-1a storing a core condition of the first operation set A, a page 111-1-3a storing an additional condition of the first operation set A, a page 111-1-2a storing a core condition of the second operation set B, and a page 111-1-4a storing an additional condition of the second operation set B.

The core condition and the additional condition illustrated in FIGS. 5A and 5B may be stored in pages, different from each other, respectively, but the present disclosure is not limited thereto. In the present disclosure, a core condition and an additional condition corresponding to the core condition may be stored in the same page.

Although the core condition/additional condition may be stored in a respective page in FIGS. 5A and 5B, the present disclosure is not necessarily limited thereto. It should be understood that the core condition/additional condition of the present disclosure are stored in types of regions, different from each other, accessible by addresses, different from each other.

Figure 6A:
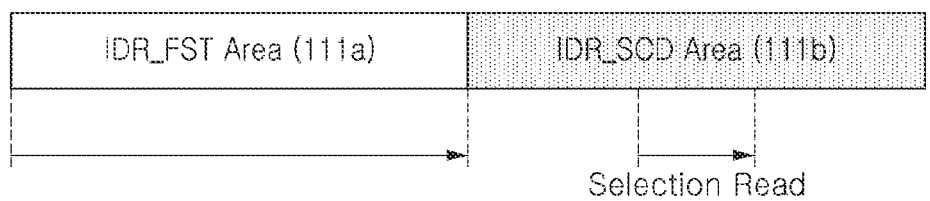
FIGS. 6A and 6B are block diagrams illustrating embodiments of a scanning method for initial data in an initialization operation.
Figure 6B:
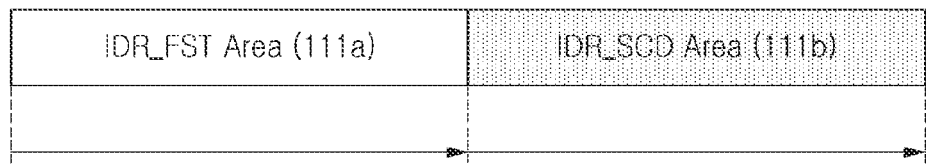

FIGS. 6A and 6B illustrate embodiments of a scanning method for initial data in an initialization operation.

Referring to FIG. 6A, in an initialization operation, an entire area of a first initial data area 111a may be scanned, and a partial area of a second initial data area 111b may be scanned. In this case, the second initial data area 111b may be a region selected by a user.

In an embodiment, a non-volatile memory device 100 may receive read commands and addresses, different from each other, for reading the first initial data area 111a and the second initial data area 111b.

As illustrated in FIG. 6B, an entire area of a second initial data area 111b may be scanned in an initialization operation.

In this case, a non-volatile memory device may select a partial area among the entire scanned region as second initial data IDR_SCD.

In general, an initialization operation may include an initial read operation of reading initial data stored in a meta area, a dump-down operation of verifying validity of initial data stored in a page buffer circuit according to the initial read operation and storing the initial data in the page buffer circuit, and a subsequent process of setting conditions for operation of a non-volatile memory device in a register, based on the initial data stored in the page buffer circuit. For example, the subsequent processes may include setting levels of operating voltages, "WORscan" for excluding a buffer of a bad column from a pass/fail operation, and the like. In an embodiment, the read level may be adjusted in an initial read operation differently from a general read operation. Details related to a read level change in the initial read operation may be found in US 2021-0097010, which is incorporated by reference in this application.

It should be understood that a scanning method of initial data in an initialization operation is not limited to FIGS. 6A and 6B.

Figures 7, 8:
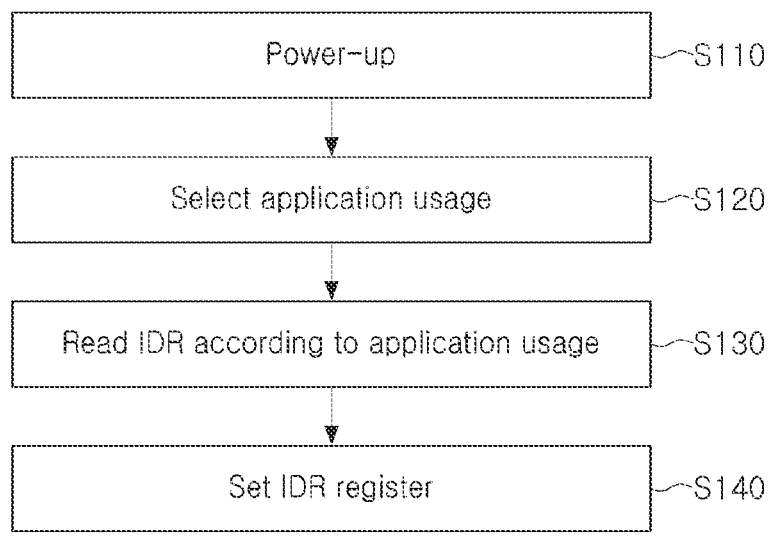
FIG. 7 is a tabular diagram illustrating initial data according to an embodiment of the present disclosure.
FIG. 8 is a flowchart diagram illustrating an initialization operation of storage according to an embodiment of the present disclosure.

FIG. 7 illustrates initial data according to an embodiment of the present disclosure. Referring to FIG. 7, first initial data IDR_FST may include performance parameters related to a non-volatile memory device 100, and second initial data IDR_SCD may include reliability parameters related to the non-volatile memory device 100.

In an embodiment, the performance parameters may include a read time tR, a program time tPROG, an erase time tERS, and the like. In an embodiment, the reliability parameters may include a retention-related parameter, an endurance-related parameter, a width and level of a step pulse of an incremental step pulse program (ISPP), a recovery voltage, a verification method, the number of verification target states, and the like. It should be understood that the performance parameters and the reliability parameters of the present disclosure are not limited thereto.

FIG. 8 illustrates an initialization operation of storage according to an embodiment of the present disclosure. Referring to FIGS. 1 to 8, an initialization operation of a storage device 10 according to an embodiment of the present disclosure may be performed as follows.

As power is supplied, a power-up operation may be performed (S110). In this case, an application usage may be selected in a controller 200 (S120). An initialization command IDR CMD and an address according to the selected application usage may be transmitted to a non-volatile memory device 100. The non-volatile memory device 100 may perform a read operation on initial data according to the application usage (S130). In this case, the initial data may include first initial data IDR_FST and second initial data IDR_SCD. The first initial data IDR_FST and the second initial data IDR_SCD may be stored in registers 101 and 102, corresponding thereto. Therefore, the initial data of the non-volatile memory device 100 may be set (S140).

Figure 9:
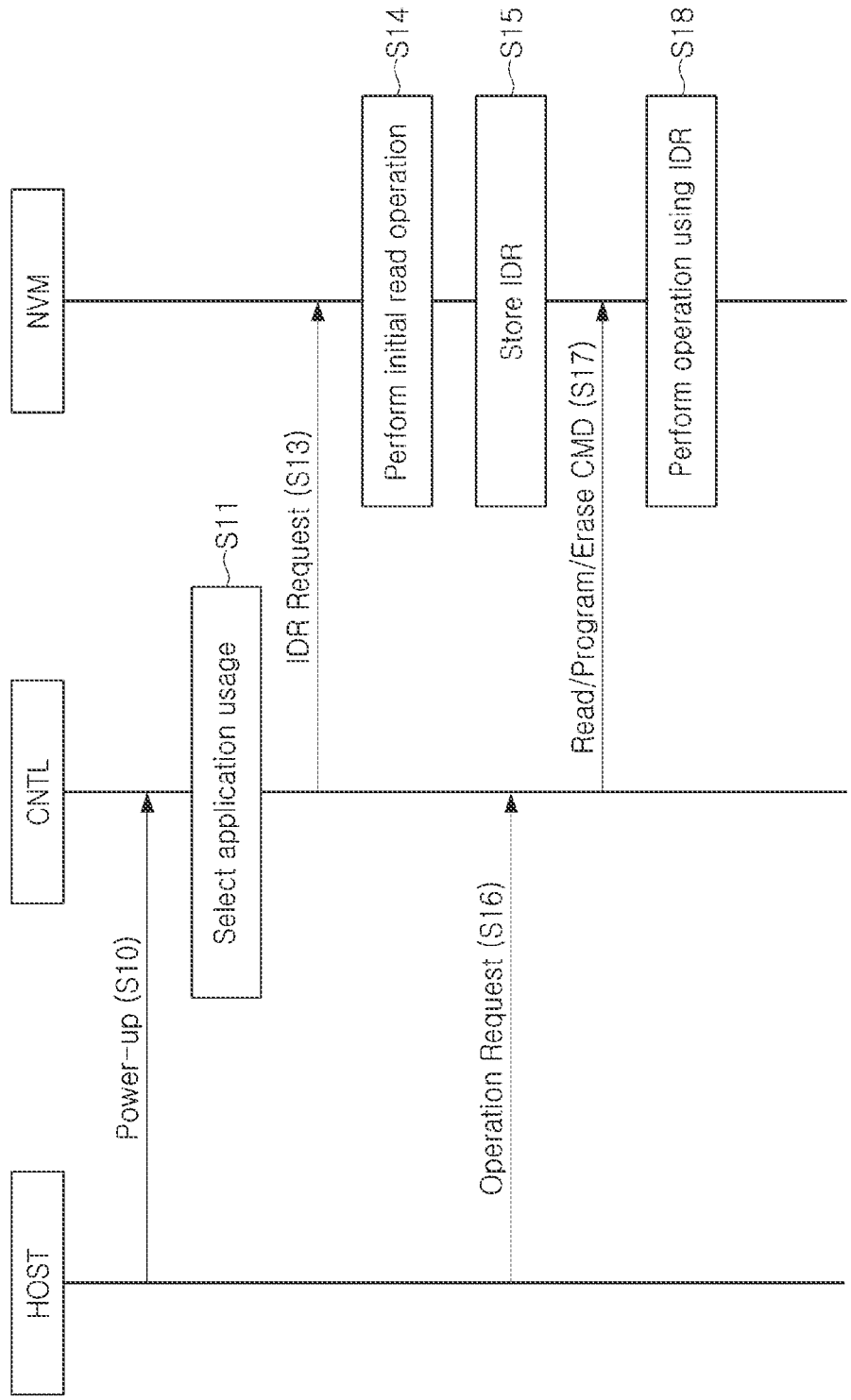
FIG. 9 is a ladder diagram illustrating a method of operating a storage device according to an embodiment of the present disclosure.

FIG. 9 illustrates a method of operating a storage device according to an embodiment of the present disclosure. Referring to FIGS. 1 to 9, an operation method of a storage device 10 may proceed as follows.

A host may transmit a power-up request to a controller CNTL of the storage device 10 (S10). In this case, the power-up request may be directly performed according to power supply or may be performed according to a separate command from the host. The controller CNTL may select an application usage of a non-volatile memory device NVM according to the power-up request (S11). Thereafter, the controller CNTL may transmit a read request (i.e., an initial read request) for initial data IDR according to the selected application usage (S13). The initial read request may include a read command and an address corresponding thereto. In this case, the address may include a first address for reading first initial data IDR_FST corresponding to the selected application usage, and a second address for reading second initial data IDR_SCD corresponding to the selected application usage. In an embodiment, the initial read request may be arbitrarily transmitted to the non-volatile memory device NVM according to a power-up operation or an operation for optimizing performance or reliability.

The non-volatile memory device NVM may perform an initial read operation in response to the read request for initial data (S14). In this case, the initial read operation may include a first read operation of reading the first initial data and a second read operation of reading the second initial data. In an embodiment, the first read operation and the second read operation may be performed in response to one initial read command. In an embodiment, the first read operation and the second read operation may be performed in response to initial read commands, different from each other. In an embodiment, the first initial data and the second initial data may be stored in regions accessed by addresses, different from each other.

The first initial data IDR_FST and the second initial data IDR_SCD may be read from a meta block, based on the initial read operation. Thereafter, the non-volatile memory device NVM may store the initial data IDR_FST and IDR_SCD in the registers 101 and 102 (refer to FIG. 1).

Thereafter, the host may transmit an operation request (e.g., a read/write/delete request) to the storage device 10 (S16). The controller CNTL may transmit a read/program/erase command, corresponding to the operation request, to the non-volatile memory device NVM (S17). The non-volatile memory device NVM may use the initial data stored in the registers 101 and 102 for initialization to perform an operation corresponding to the received command by (S18).

A storage device according to an embodiment of the present disclosure may include an artificial processor dedicated to initialization setting.

Figure 10:
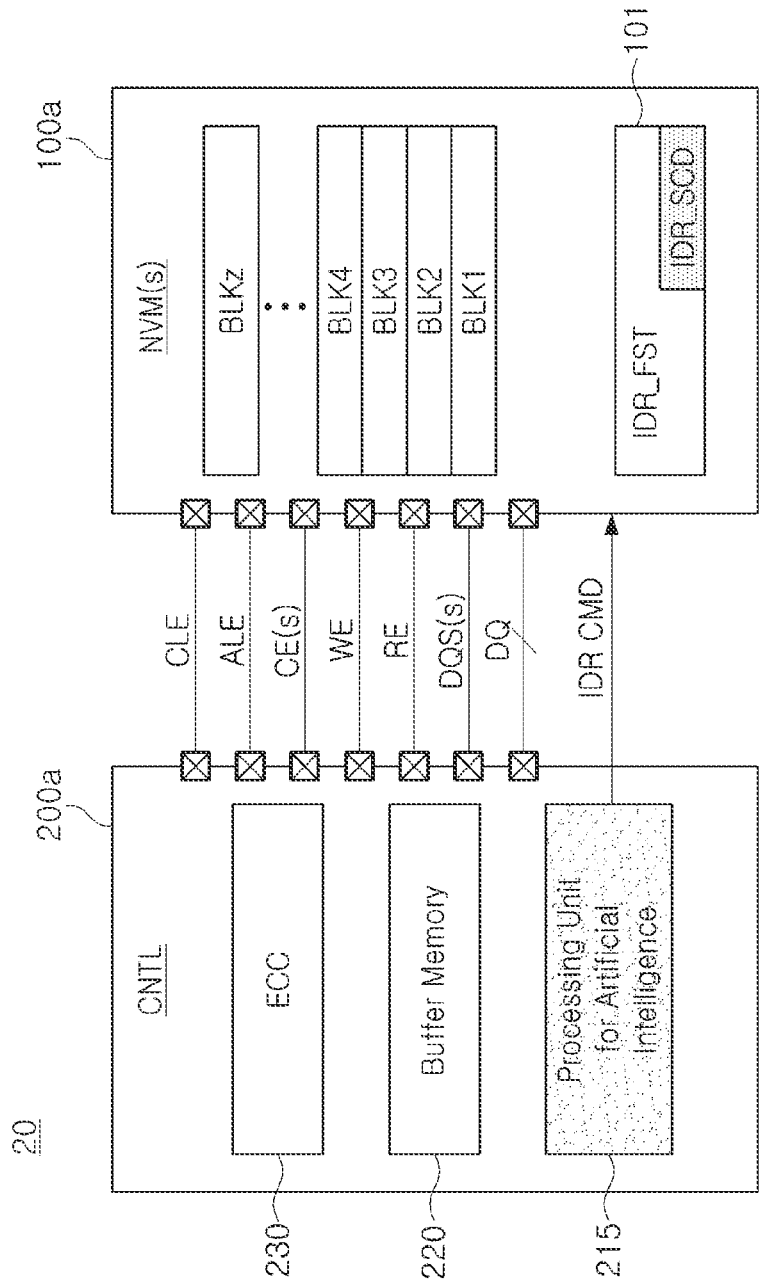
FIG. 10 is a block diagram illustrating a storage device 20 according to another embodiment of the present disclosure.

FIG. 10 illustrates a storage device 20 according to another embodiment of the present disclosure. Referring to FIG. 10, a controller 200a of a storage device 20 may include a processor 215 for artificial intelligence, controlling an initialization operation, as compared to that illustrated in FIG. 1. The processor 215 may be implemented to manage the initialization operation described in FIGS. 1 to 9. A non-volatile memory device 100a may set initial data (e.g., IDR_FST and IDR_SCD) according to control of the processor 215.

A non-volatile memory device according to an embodiment of the present disclosure may be implemented in a chip to chip (C2C) structure.

Figure 11:
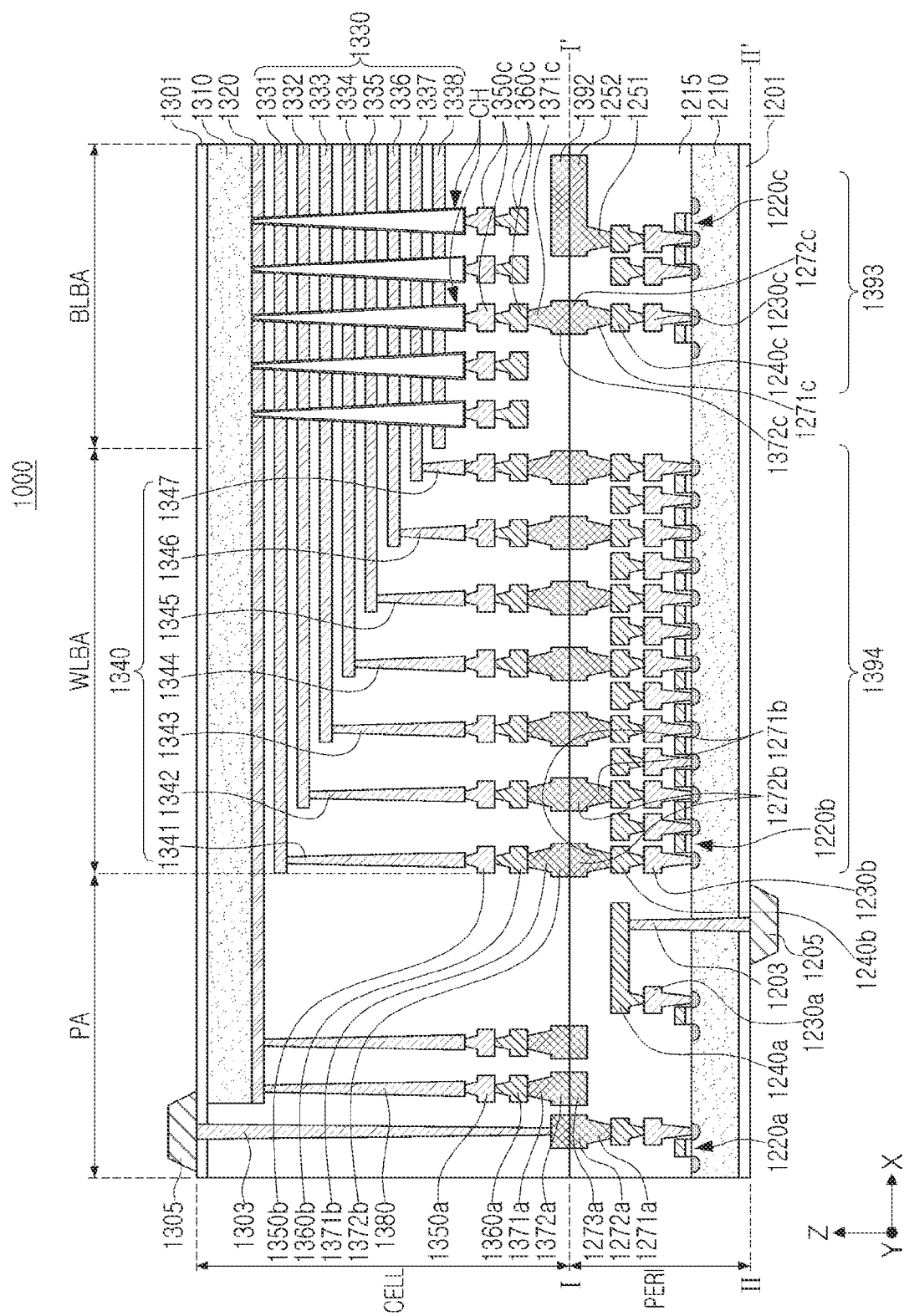
FIG. 11 is a structural diagram illustrating a non-volatile memory device 1000 implemented in a Chip-to-Chip (C2C) structure according to an embodiment of the present disclosure.

FIG. 11 illustrates a non-volatile memory device 1000 implemented in a C2C structure according to an embodiment of the present disclosure. In this case, a C2C structure may refer that an upper chip including a cell region CELL is prepared on a first wafer, a lower chip including a peripheral circuit region PERI is prepared on a second wafer, different from the first wafer, and the upper chip and the lower chip are connected to each other by a bonding method. For example, the bonding method may be a method of electrically connecting a bonding metal formed on an uppermost metal layer of the upper chip and a bonding metal formed on an uppermost metal layer of the lower chip. In an embodiment, when the bonding metal is formed of copper (Cu), the bonding method may be a Cu—Cu bonding method. In another embodiment, the bonding metal may be formed of aluminum (Al) or tungsten (W).

Each of the peripheral circuit region PERI and the cell region CELL of the non-volatile memory device 1000 may include an external pad bonding area PA, a word-line bonding area WLBA, and a bit-line bonding area BLBA.

The peripheral circuit region PERI may include a first substrate 1210, an interlayer insulating layer 1215, a plurality of circuit elements 1220a, 1220b, and 1220c formed on the first substrate 1210, first metal layers 1230a, 1230b, and 1230c respectively connected to the plurality of circuit elements 1220a, 1220b, and 1220c, and second metal layers 1240a, 1240b, and 1240c respectively formed on the first metal layers 1230a, 1230b, and 1230c. In an embodiment, the first metal layers 1230a, 1230b, and 1230c may be formed of tungsten having relatively high resistivity. In an embodiment, the second metal layers 1240a, 1240b, and 1240c may be formed of copper having a relatively low resistivity.

As illustrated in FIG. 11, the first metal layers 1230a, 1230b, and 1230c and the second metal layers 1240a, 1240b, and 1240c are illustrated, but the present disclosure will not be limited thereto. At least one metal layer may be further formed on the second metal layers 1240a, 1240b, and 1240c. At least a portion of the one or more metal layers formed on the second metal layers 1240a, 1240b, and 1240c may be formed of aluminum having a resistivity, different from that of copper forming the second metal layers 1240a, 1240b, and 1240c.

In an embodiment, the interlayer insulating layer 1215 may be disposed on the first substrate 1210 to cover the plurality of circuit elements 1220a, 1220b, and 1220c, the first metal layers 1230a, 1230b, and 1230c, and the second metal layers 1240a, 1240b, and 1240c. In an embodiment, the interlayer insulating layer 1215 may include an insulating material such as silicon oxide, silicon nitride, or the like.

Lower bonding metals 1271b and 1272b may be formed on the second metal layer 1240b of the word-line bonding area WLBA. In the word-line bonding area WLBA, the lower bonding metals 1271b and 1272b of the peripheral circuit region PERI may be electrically connected to upper bonding metals 1371b and 1372b of the cell region CELL by a bonding method. In an embodiment, the lower bonding metals 1271b and 1272b and the upper bonding metals 1371b and 1372b may be formed of aluminum, copper, tungsten, or the like. Additionally, the upper bonding metals 1371b and 1372b of the cell region CELL may be referred to as first metal pads, and the lower bonding metals 1271b and 1272b may be referred to as second metal pads.

The cell region CELL may include at least one memory block. In an embodiment, the cell region CELL may include a second substrate 1310 and a common source line 1320. On the second substrate 1310, a plurality of word-lines 1331 to 1338 (i.e., 1330) may be stacked in a direction (a Z-axis direction), perpendicular to an upper surface of the second substrate 1310. In an embodiment, string select lines and ground select line may be respectively disposed on and below the word-lines 1330. In an embodiment, the plurality of word-lines 1330 may be disposed between the string select lines and the ground select line.

In the bit-line bonding area BLBA, a channel structure CH may extend in a direction (the Z-axis direction), perpendicular to the upper surface of the second substrate 1310, to pass through the word-lines 1330, the string select lines, and the ground select line. The channel structure CH may include a data storage layer, a channel layer, and a buried insulating layer, and the channel layer may be electrically connected to a first metal layer 1350c and a second metal layer 1360c. For example, the first metal layer 1350c may be a bit-line contact, and the second metal layer 1360c may be a bit-line. In an embodiment, the bit-line 1360c may extend in a first direction (a Y-axis direction), parallel to the upper surface of the second substrate 1310.

As illustrated in FIG. 11, a region in which the channel structure CH, the bit-line 1360c, and the like are arranged may be defined as the bit-line bonding area BLBA. In an embodiment, the bit-line 1360c may be electrically connected to the circuit elements 1220c providing a page buffer 1393 in the peripheral circuit region PERI, in the bit-line bonding area BLBA. For example, the bit-line 1360c may be connected to upper bonding metals 1371c and 1372c in the peripheral circuit region PERI. In this case, the upper bonding metals 1371c and 1372c may be connected to lower bonding metals 1271c and 1272c connected to the circuit elements 1220c of the page buffer 1393. In the word-line bonding area WLBA, the word-lines 1330 may extend in a second direction (the X-axis direction), parallel to the upper surface of the second substrate 1310. In an embodiment, the word-line bonding area WLBA may be connected to a plurality of cell contact plugs 1341 to 1347 (i.e., 1340). For example, the word-lines 1330 and the cell contact plugs 1340 may be connected to each other by pads provided with at least a portion of the word-lines 1330 extending in the second direction and having different lengths. In an embodiment, the first metal layer 1350b and the second metal layer 1360b may be sequentially connected to the cell contact plugs 1340 connected to the word-lines 1330. In an embodiment, the cell contact plugs 1340 may be connected to the peripheral circuit region PERI by the upper bonding metals 1371b and 1372b of the cell region CELL and the lower bonding metals 1271b and 1272b of the peripheral circuit region PERI in the word-line bonding area WLBA.

In an embodiment, the cell contact plugs 1340 may be electrically connected to the circuit elements 1220b providing the row decoder 1394 in the peripheral circuit region PERI. In an embodiment, operating voltages of the circuit elements 1220b providing the row decoder 1394 may be different from operating voltages of the circuit elements 1220c providing a page buffer 1393. For example, the operating voltages of the circuit elements 1220c providing the page buffer 1393 may be greater than the operating voltages of the circuit elements 1220b providing the row decoder 1394.

A common source line contact plug 1380 may be disposed in the external pad bonding area PA. In an embodiment, the common source line contact plug 1380 may be formed of a conductive material such as a metal, a metal compound, polysilicon, or the like. The common source line contact plug 1380 may be electrically connected to the common source line 1320. A first metal layer 1350a and a second metal layer 1360a may be sequentially stacked on the common source line contact plug 1380. For example, an area in which the common source line contact plug 1380, the first metal layer 1350a, and the second metal layer 1360a are arranged may be defined as the external pad bonding area PA. The second metal layer 1360a may be electrically connected to an upper metal via 1371a. The upper metal via 1371a may be electrically connected to an upper metal pattern 1372a.

Input/output pads 1205 and 1305 may be arranged in the external pad bonding area PA. Referring to FIG. 11, a lower insulating layer 1201 covering a lower surface of the first substrate 1210 may be formed below the first substrate 1210. Also, a first input/output pad 1205 may be formed on the lower insulating layer 1201. In an embodiment, the first input/output pad 1205 may be connected to at least one of a plurality of circuit elements 1220a, 1220b, and 1220c, arranged in the peripheral circuit region PERI, by a first input/output contact plug 1203. In an embodiment, the first input/output pad 1205 may be separated from the first substrate 1210 by the lower insulating layer 1201. In addition, since a lateral insulating layer may be disposed between the first input/output contact plug 1203 and the first substrate 1210, the first input/output contact plug 1203 and the first substrate 1210 may be electrically separated.

Referring to FIG. 11, an upper insulating layer 1301 may be formed on the second substrate 1310 to cover the upper surface of the second substrate 1310. Also, a second input/output pad 1305 may be disposed on the upper insulating layer 1301. In an embodiment, the second input/output pad 1305 may be connected to at least one of a plurality of circuit elements 1220a, 1220b, and 1220c, arranged in the peripheral circuit region PERI, by a second input/output contact plug 1303, a lower metal pattern 1272a, and a lower metal via 1271a.

In an embodiment, the second substrate 1310, the common source line 1320, and the like may not be disposed in an area where the second input/output contact plug 1303 is disposed. Also, the second input/output pad 1305 may not overlap the word-lines 1380 in a third direction (the Z-axis direction). Referring to FIG. 11, the second input/output contact plug 1303 may be separated from the second substrate 1310 in a direction, parallel to the upper surface of the second substrate 1310. Also, the second input/output contact plug 1303 may pass through an interlayer insulating layer 1315 of the cell region CELL, and may be connected to the second input/output pad 1305. In an embodiment, the second input/output pad 1305 may be electrically connected to the circuit element 1220a.

In an embodiment, the first input/output pad 1205 and the second input/output pad 1305 may be selectively formed. For example, the non-volatile memory device 1000 may include the first input/output pad 1205 disposed on the first substrate 1201, or alternatively it may include the second input/output pad 1305 disposed on the second substrate 1301. In another embodiment, the non-volatile memory device 1000 may include both of the first input/output pad 1205 and the second input/output pad 1305.

A metal pattern of an uppermost metal layer in each of the external pad bonding area PA and the bit-line bonding area BLBA included in each of the cell region CELL and the peripheral circuit region PERI may be present as a dummy pattern, or the uppermost metal layer may be empty.

A non-volatile memory device according to an embodiment of the present disclosure may selectively use information data suitable for a user's intended application or area of use. In an embodiment, one or more pieces of information data may be written in a predetermined Page/Block/MAT of the non-volatile memory device. After selecting such information data according to a situation, the selected information data may be read, and the read information data may be used to drive the non-volatile memory device.

In an embodiment, in setting an initialization condition for operating a non-volatile memory device, a condition suitable for a characteristic (e.g., performance or reliability) desired by a user may be used selectively by information data without setting additional conditions or replacing the non-volatile memory device. In addition, a time period required to change the suitable conditions may be eliminated.

In an embodiment, in order to selectively use the information data, various types of initial data may be stored on-chip, and the user may select a condition suitable for an intended application or area of use from the stored initial data.

A non-volatile memory device, a storage device including the same, and an operating method thereof, according to an embodiment of the present disclosure, may readily optimize operating conditions of a memory according to an intended application or area of use by selecting additional operation-related information according to a user selection and an application usage.

While illustrative embodiments have been shown and described, it will be apparent to those of ordinary skill in the pertinent art that modifications and variations may be made to these and other embodiments without departing from the scope of the present disclosure as defined by the appended claims.

What is claimed is:

1. A non-volatile memory device comprising:
a meta area having a first region storing first initial data, and second regions storing second initial data, different from each other;
a user area configured to store user data;
an initialization register configured to store the first initial data or the second initial data, and to update the second initial data in whole or in part; and
control logic configured to receive a command latch enable signal, an address latch enable signal, a chip enable signal, a write enable signal, a read enable signal, and a data strobe signal through control pins and latch a command or an address at an edge of the write enable signal according to the chip enable signal and the address latch enable signal, to perform a read operation, a program operation, or an erase operation using the initial data stored in the initialization register,
wherein one of the first initial data or the second initial data comprises at least one performance parameter related to an operation time of the non-volatile memory device,
wherein the other of the first initial data or the second initial data comprises at least one reliability parameter related to at least one of retention, endurance, voltage or verification of the non-volatile memory device,
wherein one of the first initial data or the second initial data is provided in common, and the other of the first initial data or the second initial data is selectable by a user.

2. The non-volatile memory device of claim 1,
wherein, during a power-up operation, an initial data read command is received externally,
wherein the at least one performance parameter includes a plurality of times for a respective plurality of memory operations of the non-volatile memory device,
wherein the at least one reliability parameter includes a plurality of voltages for the respective plurality of memory operations of the non-volatile memory device.

3. The non-volatile memory device of claim 2, wherein the control logic is configured to read the first initial data stored in the first region in response to the initial data read command, and store the read first initial data in the initialization register.

4. The non-volatile memory device of claim 3, wherein the control logic is configured to read the second initial data in a second region selected from among the second regions in response to the initial data read command, and store the read second initial data in a portion of the initialization register.

5. The non-volatile memory device of claim 3, wherein the control logic is configured to read the second initial data stored in the second regions in response to the initial data read command, and store one among the different read second initial data in the initialization register.

6. The non-volatile memory device of claim 2, wherein the initial data read command comprises a first initial data read command and a second initial data read command.

7. The non-volatile memory device of claim 6, wherein the control logic is configured to read the first initial data stored in the first region in response to the first initial data read command, and read a second initial data stored in one among the second regions, in response to the second initial data read command.

8. The non-volatile memory device of claim 1,
wherein the meta area comprises a plurality of meta blocks having a plurality of memory cells connected to a plurality of word-lines and a plurality of bit-lines,
wherein meta block one of the plurality of meta blocks comprises the first region and the second region.

9. The non-volatile memory device of claim 1,
wherein the meta area comprises a plurality of meta blocks having a plurality of memory cells connected to a plurality of word-lines and a plurality of bit-lines,
wherein at least two meta blocks of the plurality of meta blocks comprise the first region and the second region.

10. The non-volatile memory device of claim 1,
wherein the first initial data comprises at least one performance parameter related to the read operation, the program operation, or the erase operation, and
wherein the second initial data comprises at least one reliability parameter related to the read operation, the program operation, or the erase operation.

11. An operating method in a storage device having a non-volatile memory device and a controller controlling the non-volatile memory device, comprising:
performing a power-up operation by supplying power;
selecting an application usage after the power-up operation;
reading initial data according to the application usage; and
setting a register of the non-volatile memory device with the read initial data,
wherein the reading initial data according to the application usage comprises:
reading first initial data related to a core operation from the non-volatile memory device; and
reading and updating second initial data, corresponding to the core operation, according to the application usage from the non-volatile memory device,
wherein one of the first initial data or the second initial data comprises at least one performance parameter related to an operation time of at least one memory operation,
wherein the other of the first initial data or the second initial data comprises at least one reliability parameter related to at least one of retention, endurance, voltage or verification of the at least one memory operation,
wherein one of the first initial data or the second initial data is provided in common, and the other of the first initial data or the second initial data is selectable by a user.

12. The method of claim 11, further comprising transmitting an initialization operation request to the non-volatile memory device, wherein the at least one performance parameter includes a plurality of times for a respective plurality of memory operations, wherein the at least one reliability parameter includes a plurality of voltages for the respective plurality of memory operations.

13. The method of claim 12, wherein the initialization operation request comprises an initial data read command, a first address, and a second address, wherein the first address is an address indicating a region storing the first initial data, and wherein the second address is an address indicating a region storing the second initial data.

14. The method of claim 11, wherein the first initial data comprises a read time, a program time, or an erase time, for setting a memory operation.

15. The method of claim 11, further comprising performing a read operation, a program operation, or an erase operation using data set in the register of the non-volatile memory device.

16. A non-volatile memory device comprising:
a memory cell array having a plurality of memory blocks having a plurality of memory cells connected to a plurality of word-lines and a plurality of bit-lines;
a row decoder configured to select a memory block, among the plurality of memory blocks, in response to an address;
a voltage generator configured to apply word-line voltages corresponding to a selected word-line and unselected word-lines, among the plurality of word-lines;
page buffers connected to the plurality of bit-lines and reading data from memory cells connected to the selected word-line of the selected memory block among the plurality of memory blocks; and
control logic configured to control the row decoder, the voltage generator, and the page buffers,
wherein at least one memory block, among the plurality of memory blocks, comprises a first region configured to store first initial data, and second regions configured to store second initial data, different from each other, and
wherein the control logic is configured to read the first initial data stored in the first region and the second initial data stored in a second region, among the second regions, according to an initialization operation request, store the first initial data in an initialization register, and to store and update the second initial data in at least a portion of the initialization register, wherein one of the first initial data or the second initial data comprises at least one performance parameter related to an operation time of the non-volatile memory device, wherein the other of the first initial data or the second initial data comprises at least one reliability parameter related to at least one of retention, endurance, voltage or verification of the non-volatile memory device, wherein one of the first initial data or the second initial data is provided in common, and the other of the first initial data or the second initial data is selectable by a user.

17. The non-volatile memory device of claim 16, wherein the at least one memory block comprises single-level cells, wherein the at least one performance parameter includes a plurality of times for a respective plurality of memory operations, wherein the at least one reliability parameter includes a plurality of voltages for the respective plurality of memory operations.

18. The non-volatile memory device of claim 16, wherein the first initial data comprises a core condition related to a memory operation, and wherein the second initial data comprises an additional condition corresponding to the core condition.

19. The non-volatile memory device of claim 18, wherein the core condition comprises a plurality of core conditions, different from each other, wherein the plurality of core conditions are stored in regions, different from each other, separated by an address.

20. The non-volatile memory device of claim 18, wherein the additional condition comprises a plurality of additional conditions, different from each other, wherein the plurality of additional conditions are stored in regions, different from each other, separated by an address.

* * * * *